(12) United States Patent
Yamaguchi et al.

(10) Patent No.: US 9,011,604 B2
(45) Date of Patent: Apr. 21, 2015

(54) MANUFACTURING METHOD OF SEMICONDUCTOR DEVICE

(75) Inventors: Daigorou Yamaguchi, Toyota (JP); Yoshitaka Noda, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/151,367

(22) Filed: Jun. 2, 2011

(65) Prior Publication Data

US 2012/0000484 A1 Jan. 5, 2012

(30) Foreign Application Priority Data

Jun. 16, 2010 (JP) ................................ 2010-137228
May 24, 2011 (JP) ................................ 2011-115742

(51) Int. Cl.
| | | |
|---|---|---|
| B08B 3/08 | (2006.01) | |
| H01L 29/06 | (2006.01) | |
| B81C 1/00 | (2006.01) | |
| H01L 21/02 | (2006.01) | |
| H01L 29/78 | (2006.01) | |
| H01L 29/10 | (2006.01) | |
| H01L 29/66 | (2006.01) | |

(52) U.S. Cl.
CPC ....... *H01L 29/0634* (2013.01); *B81B 2203/033* (2013.01); *B81C 1/00849* (2013.01); *H01L 21/02057* (2013.01); *H01L 29/1095* (2013.01); *H01L 29/66181* (2013.01); *H01L 29/66734* (2013.01); *H01L 29/7811* (2013.01); *H01L 29/7813* (2013.01)

(58) Field of Classification Search
USPC ....................................................... 134/2, 29
See application file for complete search history.

(56) References Cited

U.S. PATENT DOCUMENTS

| | | | |
|---|---|---|---|
| 5,290,361 A | | 3/1994 | Hayashida et al. |
| 5,302,311 A | * | 4/1994 | Sugihara et al. ............. 510/175 |
| 7,718,009 B2 | * | 5/2010 | Verhaverbeke et al. .......... 134/3 |
| 2001/0003061 A1 | * | 6/2001 | Chen et al. .................... 438/655 |
| 2004/0127044 A1 | * | 7/2004 | Verhaverbeke et al. ....... 438/689 |
| 2005/0271870 A1 | * | 12/2005 | Jackson .................... 428/297.7 |
| 2006/0025320 A1 | * | 2/2006 | Borner et al. ................. 510/175 |
| 2006/0089280 A1 | * | 4/2006 | Vos et al. ...................... 510/175 |
| 2006/0166403 A1 | * | 7/2006 | Ouellet et al. ................ 438/109 |
| 2008/0196742 A1 | * | 8/2008 | Beck ............................. 134/1.3 |
| 2008/0283912 A1 | | 11/2008 | Shibata et al. |

FOREIGN PATENT DOCUMENTS

| | | |
|---|---|---|
| JP | A-H06-216098 | 8/1994 |
| JP | A-09-213665 | 8/1997 |

(Continued)

OTHER PUBLICATIONS

OA dated May 9, 2013 in the corresponding CN application No. 201110161985.2.

(Continued)

*Primary Examiner* — Michael Kornakov
*Assistant Examiner* — Katelyn Whatley
(74) *Attorney, Agent, or Firm* — Posz Law Group, PLC

(57) ABSTRACT

In a manufacturing method of a semiconductor device, a depression is formed in a semiconductor substrate made of silicon or silicon compound semiconductor, and foreign substances including a protection layer in the depression is removed with a cleaning solution. The cleaning solution includes a mixed solution of hydrogen peroxide water to which a chelator is added, a basic solution, and water.

4 Claims, 7 Drawing Sheets

(56) References Cited

FOREIGN PATENT DOCUMENTS

| JP | A-H11-111660 | 4/1999 |
| JP | A-2000-091290 | 3/2000 |
| JP | 2006319282 A * | 11/2006 |
| JP | A-2006-319282 | 11/2006 |
| JP | A-2009-141307 | 6/2009 |

OTHER PUBLICATIONS

Office Action mailed Oct. 23, 2012 in corresponding JP Application No. 2011-115742 (and English translation).
OA dated Feb. 27, 2014 in the corresponding CN application No. 201110161985.2.

* cited by examiner

MANUFACTURING METHOD OF SEMICONDUCTOR DEVICE

CROSS REFERENCE TO RELATED APPLICATIONS

The present application is based on and claims priority to Japanese Patent Applications No. 2010-137228 filed on Jun. 16, 2010, and No. 2011-115742 filed on May 24, 2011, the contents of which are incorporated in their entirety herein by reference.

BACKGROUND OF THE INVENTION

1. Field of the Invention

The present invention relates to a manufacturing method of a semiconductor device including a process of removing foreign substances such as reaction product, which is formed on an inner wall of a trench when the trench is formed, with a cleaning solution after the trench is formed.

2. Description of the Related Art

Conventionally, a reactive ion etching (RIE) is used as a method of processing a trench to a semiconductor substrate. However, a trench having a higher aspect ratio is desired and a new trench processing technique such as so-called BOSCH process has been developed. The BOSCH process is a method of forming a trench having a high aspect ratio by digging a bottom of the trench while covering a sidewall of the trench with a protection layer. The BOSCH process using high density plasma such as inductive coupling plasma (ICP) and electron cyclotron resonance (ECR) enables processing of a trench having an aspect ratio of 50 or higher. Then, after forming the trench, a cleaning technique that can certainly remove foreign substances such as a reaction product formed on an inner wall of the trench when the trench is formed is required. The aspect ratio is a ratio of a depth of a trench to an opening width of the trench.

JP-A-2009-141307 discloses a method in which a mixed solution of sulfuric acid and hydrogen peroxide water is used as a cleaning solution. However, in a case where the mixed solution of sulfuric acid and hydrogen peroxide water is used as the cleaning solution, the following problems arise. (I) Because the mixed solution has a high viscosity, the mixed solution cannot be supplied to a bottom of a trench. (II) A lift-off effect of floating foreign substances such a reaction product existing in a trench is not achieved. (III) Although it is required to perform ultrasonic cleaning in order that a mixed solution having a high viscosity penetrates to a bottom of a trench, the ultrasonic cleaning cannot be performed because fine structure will be damaged. (IV) An effect of preventing condensation of foreign substances and an effect of preventing reattachment of foreign substances to an inner wall of a trench cannot be achieved.

JP-A-2006-319282 discloses a method in which a mixed solution of hydrogen peroxide water, ammonia water, and water is used as a cleaning solution. However, in a case where the mixed solution of hydrogen peroxide water, ammonia water, and water is used as the cleaning solution, the following problems arise. (I) An effect of preventing condensation of foreign substances and an effect of preventing reattachment of foreign substances to an inner wall of a trench cannot be achieved. (II) Foreign substances in the vicinity of a bottom of a trench may be reattached to an inner wall of the trench. (III) Although ultrasonic cleaning is effective to prevent reattachment, the ultrasonic cleaning cannot be performed because fine structure will be damaged.

Thus, in cases where the above-described cleaning solutions are used, there is a possibility that foreign substances cannot be removed with certainty to a bottom of a trench having a high aspect ratio.

SUMMARY OF THE INVENTION

In view of the foregoing problems, it is an object of the present invention to provide a manufacturing method of a semiconductor device that can certainly remove foreign substances such as reaction product, which is formed on an inner wall of a trench when the trench is formed, after forming the trench.

In a manufacturing method of a semiconductor device according to an aspect of the present invention, a depression is formed in a semiconductor substrate made of silicon or silicon compound semiconductor, and foreign substances including a protection layer that exist in the depression is removed with a cleaning solution. The cleaning solution includes a mixed solution of hydrogen peroxide water to which a chelator is added, a basic solution, and water.

By the above-described manufacturing method, the foreign substances including the protection layer can be certainly removed from the depression without causing damage in the depression.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

A first embodiment of the present invention will be described. In the present embodiment, a manufacturing method of a semiconductor device in which a trench having a high aspect ratio is formed in a semiconductor substrate will be described. In the manufacturing method of the semiconductor device, processes except for a cleaning process of an inside of trenches performed after forming the trenches are similar to those of the conventional art. Thus, the cleaning process will be described here.

The cleaning process is a process of removing foreign substances that exist in trenches with a cleaning solution. By performing the cleaning process after performing a trench forming process, for example, by the BOSCH process to a semiconductor substrate, trenches having a high aspect ratio are formed to the semiconductor substrate. In the BOSCH process, inner walls of the trenches are covered with a protection layer made of fluorocarbon polymer. Thus, the cleaning process is performed to remove foreign substances including the protection layer.

Then, an epitaxial growing process is performed to fill the trenches, and thereby the semiconductor device can be manufactured. For example, by forming a semiconductor layer having a conductivity type different from the semiconductor substrate in the trenches, a super junction structure that repeatedly configurates a PN junction can be formed. In a case where an electrode is formed in the trench that penetrates the semiconductor substrate, a through electrode can be formed. Furthermore, a trench capacitor configurating a capacitor can be formed using the trench and a micro electro mechanical system (MEMS) including a beam structure body using the trench can be formed.

The cleaning process will be described with reference to FIG. 1A to FIG. 1D. During a process shown in FIG. 1A, trenches 3 are formed by etching a silicon substrate 1 serving as a semiconductor substrate in a state where a mask 2 is disposed on the silicon substrate 1. The process can be performed by the BOSCH process in which bottoms of the trenches 3 are dug while sidewalls of the trenches are covered with a protection layer 4. Accordingly, the trenches 3 having a high aspect ratio can be formed.

Figure 1A:
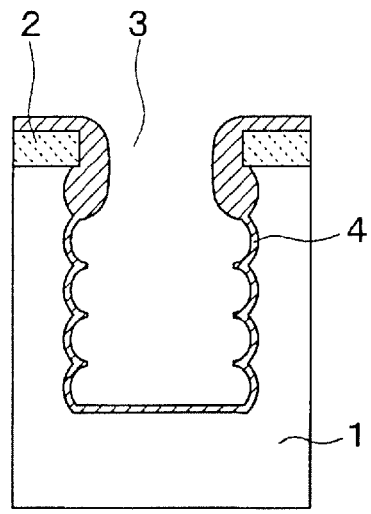
FIG. 1A to FIG. 1D are cross-sectional views showing a cleaning process of an inside of a trench in a manufacturing method of a semiconductor device according to a first embodiment.
Figure 1B:
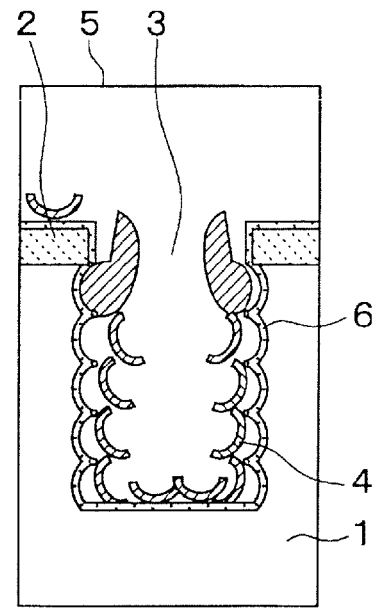

During a process shown in FIG. 1B, a plurality of silicon substrates 1 in which the trenches 3 are formed is soaked in a cleaning solution 5 heated to a temperature within a range from 50° C. to 100° C., and thereby the cleaning solution 5 penetrates in the trenches 3. The cleaning solution 5 is a mixed solution of hydrogen peroxide water to which a chelator is added, ammonia water, and water. The chelator has effects of removing heavy metal, preventing condensation of foreign substances such as particles, and preventing deterioration of hydrogen peroxide water.

The chelator includes, for example, at least one of ethylenediaminetetraacetate (EDTA), hexametaphosphoric acid (HP), 1-hydroxyethylidene-1,1-diphosphonic acid (HDP), nitrilotris (methylenephosphonic acid) (NTPO), ethylenediaminetetrakis (methylenephosphonic acid) (EDTPO), diethylenetriaminepenta (methylene phosphonic acid) (ETPPO), cyclohexanediaminetetraacetic acid (CyDTA), triethylenetetraaminehexaacetic acid (TTHA), and methylene diphosphonate (MDP).

An additive amount of the chelator to the hydrogen peroxide water is, for example, within a range from 0.5 weight % to 1.5 weight %, and may also be 1 weight % or lower. In the cleaning solution, a mixture ratio of the hydrogen peroxide water to which the chelator is added, the ammonia water, and water is, for example, within a range from 1:1:4 to 1:1:6. In the present case, a concentration of hydrogen peroxide in the hydrogen peroxide water is, for example, 35 weight %, and a concentration of ammonia in the ammonia water is, for example, within a range from 28 weight % to 30 weight %. The mixture ratio is volume ratio.

Because the cleaning solution 5 has a low viscosity, the cleaning solution 5 easily penetrates to deep positions in the trenches 3. Furthermore, because the cleaning solution 5 is heated to a temperature within a range from 50° C. to 100° C., the hydrogen peroxide water in the cleaning solution 5 is activated, and an oxidation effect increases. Thus, a surface of the silicon substrate 1 including the trenches 3 is oxidized and wettability (hydrophilic property) is improved, and the cleaning solution 5 more easily penetrates. By the above-described mechanism, the cleaning solution 5 can penetrate to the bottoms of the trenches 3 without external force such as ultrasonic wave.

Figure 1C:
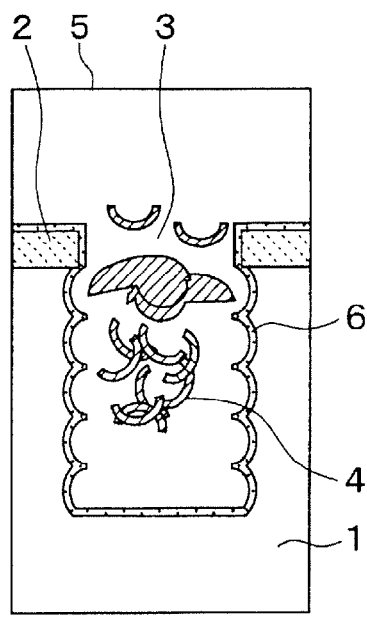

Due to the cleaning solution 5 penetrating into the trenches 3, as shown in FIG. 1C, foreign substances including the protection layer 4 are peeled off from the inner walls of the trenches 3. The surface of the silicon substrate 1 including the inside of the trenches 3 is oxidized and an oxide layer 6 is formed. Thus, the oxide layer 6 is disposed between the foreign substances including the protection layer 4 and the silicon substrate 1. The surface of the oxide layer 6 is light-etched with the ammonia water, and thereby the foreign substances including the protection layer 4 are peeled off by a lift-off effect. By the above-described mechanism, the foreign substances including the protection layer 4 in the trenches 3 can be peeled off from the inner walls of the trenches 3.

Figure 1D:
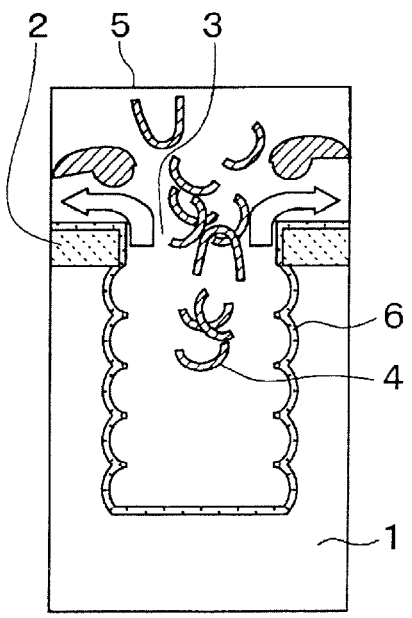

Furthermore, when the foreign substances including the protection layer 4 are peeled off from the inner walls of the trenches 3, because the chelator is added to the hydrogen peroxide water, reattachment and condensation of the foreign substances including the protection layer into the trenches 3 can be restricted. In addition, due to a repulsion effect of zeta potential of the cleaning solution 5 including the hydrogen peroxide water to which the chelator is added and the ammonia water, as shown in FIG. 1D, the foreign substances including the protection layer 4 can be easily discharged from the trenches 3. In other words, by using the cleaning solution 5 including the hydrogen peroxide water to which the chelator is added and the ammonia water, an electrification polarity on surfaces of the foreign substances including the protection layer 4 and an electrification polarity of the surface of the silicon substrate 1 (the inner walls of the trenches 3) become the same polarity and the foreign substances and the silicon substrate 1 repel each other. Then, due to the reattachment restriction effect and the repulsion effect of zeta potential by the chelator, the foreign substances including the protection layer 4 can be discharged from the trenches 3 with certainty.

After taking out the silicon substrate 1 from the cleaning solution 5, the cleaning solution 5 is rinsed away, for example, by flowing water cleaning, and the silicon substrate 1 is dried. Accordingly, the cleaning process is finished. After that, the semiconductor device can be manufactured, for example, by performing epitaxial growth to fill the trenches 3 formed to the silicon substrate 1.

As described above, in the present embodiment, as the cleaning solution 5 in the cleaning process after forming the trenches 3, the mixed solution of the hydrogen peroxide water to which the chelator is added, the ammonia water, and water is used. Accordingly, the trenches 3 can be cleaned to the bottom with certainty without causing damage in the trenches 3. Then, even when the trench 3 having a high aspect ratio is formed, the above-described cleaning process can certainly remove foreign substances to the bottoms of the trenches 3. In addition, because the chelator has the effect of removing heavy metal, heavy metal can be removed with the cleaning solution 5.

According to an experiment by the present inventors, when trenches 3 each having a width of 2 μm, a depth of 40 μm, and an aspect ratio of 20 or higher is treated with the above-described cleaning process, foreign substances including the protection layer 4 can be certainly removed to the bottoms of the trenches 3.

Figure 2A:
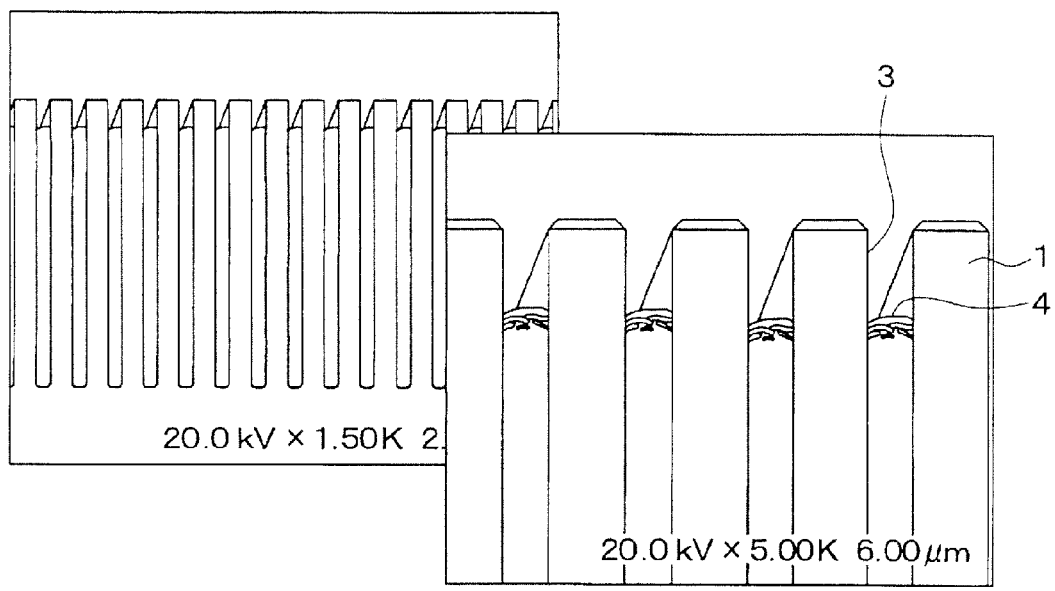
FIG. 2A is a cross-sectional view showing a state of a trench after a cleaning process in a case where a mixed solution of sulfuric acid and hydrogen peroxide water is used as a cleaning solution as a conventional method.
Figure 2B:
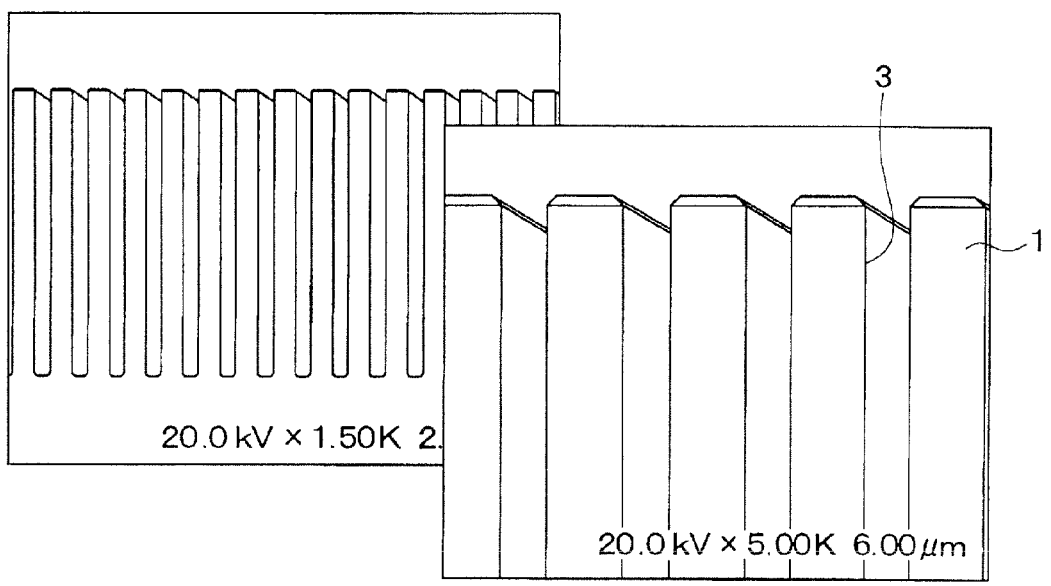
FIG. 2B is a cross-sectional view showing a state of a trench after a cleaning process in a case where a mixed solution of hydrogen peroxide water to which a chelator is added, ammonia water, and water is used as a cleaning solution as the first embodiment.

In a case where a mixed solution of sulfuric acid and hydrogen peroxide water is used as a cleaning solution as the conventional method, as shown in FIG. 2A, foreign substances including the protection layer 4 stop in the vicinity of an opening side of trenches 3, and the trenches 3 are clogged with the foreign substances including the protection layer 4. Thus, the cleaning solution 5 cannot penetrate to the bottoms of the trenches 3. In contrast, in a case where the mixed solution of the hydrogen peroxide water to which the chelator is added, the ammonia water, and water is used as the cleaning solution 5, as shown in FIG. 2B, the foreign substances including the protection later 4 can be certainly removed to the bottoms of the trenches 3.

In addition, in the present embodiment, the cleaning solution 5 is heated to a temperature within a range from 50° C. to 100° C. in the cleaning process. Thus, hydrogen peroxide water in the cleaning solution 5 is activated, and thereby oxidation effect increases, the surface of the silicon substrate 1 including the inside of the trenches 3 is oxidized and wettability (hydrophilic property) is improved, and the cleaning solution 5 easily penetrates into the trench 3.

Figure 3:
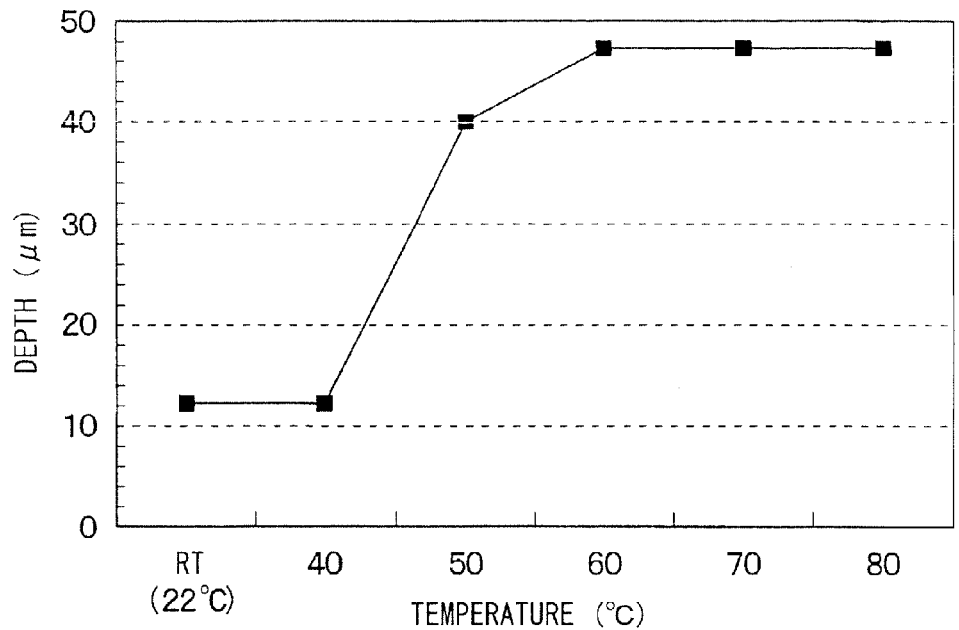
FIG. 3 is a graph showing a relationship between a temperature of a cleaning solution and a penetration depth of the cleaning solution into trenches.

FIG. 3 is a graph showing a relationship between a temperature of the cleaning solution 5 and a penetration depth of the cleaning solution 5 into the trenches 3. The penetration depth in FIG. 3 means how deep the cleaning solution 5 penetrates into the trench 3 in a case where the trenches 3 each having a width of 2 μm and a depth of 47 μm are formed to the silicon substrate 1.

As shown in FIG. 3, when the cleaning solution 5 is 40° C. or lower, the penetration depth of the cleaning solution 5 into the trenches 3 is about 12 μm. In contrast, when the cleaning solution 5 is 50° C. or higher, the penetration depth of the cleaning solution 5 into the trenches 3 drastically increases compared with the case where the cleaning solution 5 is 40° C. or lower and the cleaning solution 5 penetrates to a depth of 40 μm or more.

Figure 4:
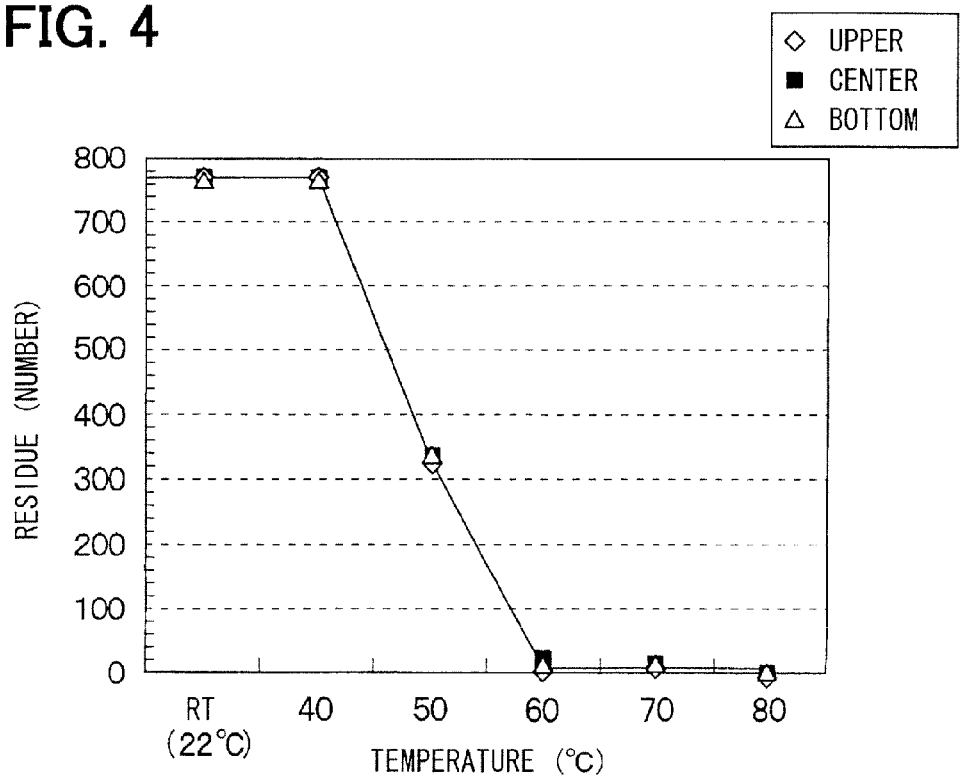
FIG. 4 is a graph showing a relationship between a temperature of a cleaning solution and the number of residues in trenches.

FIG. 4 is a graph showing results of study on a temperature of the cleaning solution and the number of residues in the trenches 3. The number of residues shown in FIG. 4 means the number of trenches 3 in which foreign substances including the protection layer 4 remain when the trenches 3 each having a width of 2 μm and the depth of 47 μm are formed and a cross section of 2307 trenches 3 is observed. In FIG. 3, the number of residues at each of upper portions, center portions, and bottom portions of the trenches 3 is shown.

As shown in FIG. 4, when the cleaning solution 5 is 50° C. or higher, the number of residues in which foreign substances are detected is almost zero. In contrast, when the cleaning solution 5 is 50° C. or lower, foreign substances including the protection layer 4 are detected in more than 700 trenches 3 in 2307 trenches 3. The number of trenches 3 in which the foreign substrates are detected is ⅓ or less of the 2307 trenches whose cross section is observed. Thus, it can be said that the cleaning solution 5 has an effect of cleaning foreign substances including the protection layer 4 even when the cleaning solution 5 is not heated. However, by heating the cleaning solution 5 to a temperature within a range from 50° C. to 100° C., the penetration depth of the cleaning solution 5 into the trenches 3 can be increased, and the foreign substrates including the protection layer 4 can be removed from the trenches 3 more certainly.

As described above, in the present embodiment, the mixture ratio of the hydrogen peroxide water to which the chelator is added, the ammonia water, and water in the cleaning solution 5 is 1:1:4 to 1:1:6. Even when the mixture ratio is other than the above-described mixture ratio, the above-described effect can be achieved. However, at least with the above-described mixture ratio, the above-described effect can be achieved with certainty.

Figure 5:
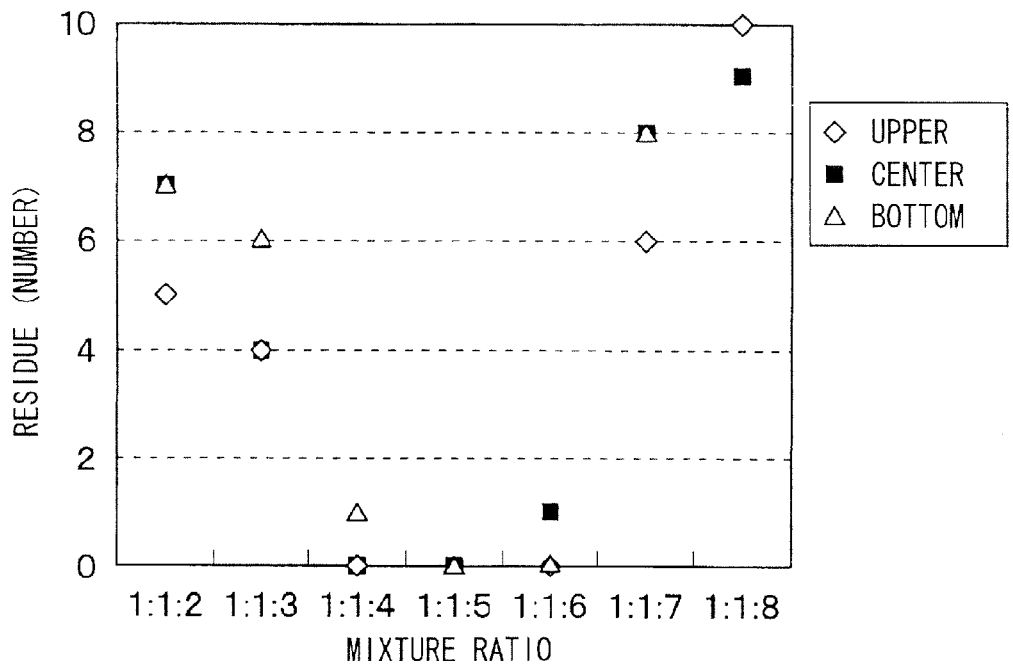
FIG. 5 is a graph showing a relationship between a mixture ratio of hydrogen peroxide water to which a chelator is added, ammonia water, and water included in a cleaning solution and the number of residues in trenches.

FIG. 5 is a graph showing results of study on the number of residues in the trenches 3 in a case where the mixture ratio of the hydrogen peroxide water to which the chelator is added, the ammonia water, and water in the cleaning solution 5. The number of residues shown in FIG. 5 means the number of trenches 3 in which foreign substances including the protection layer 4 remain when the trenches 3 each having a width of 2 μm and the depth of 47 μm are formed and a cross section of 2307 trenches 3 is observed. In FIG. 5, the number of residues at each of upper portions, center portions, and bottom portions of the trenches 3 is shown.

As shown in FIG. 5, in cases where the mixture ratio of the hydrogen peroxide water, the ammonia water, and water is 1:1:2, 1:1:3, 1:1:7, and 1:1:8, foreign substances are detected in some trenches. However, when the mixture ratio of the hydrogen peroxide water, the ammonia water, and water is within a range from 1:1:4 to 1:1:6, the number of trenches 3 in which foreign substances are detected is almost zero. Although foreign substances including the protection layer 4 is detected when the mixture ratio is 1:1:4 and 1:1:6, the foreign substances are detected in only one of 2307 trenches 3. Thus, when the mixture ratio of the hydrogen peroxide water, the ammonia water, and water is within a range from 1:1:4 to 1:1:6, foreign substances including the protection layer 4 can be completely removed.

Figure 6:
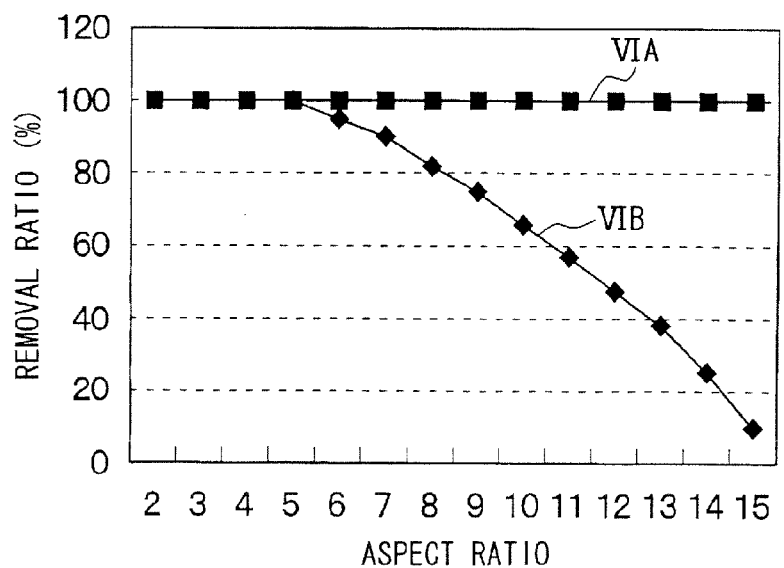
FIG. 6 is a graph showing a relationship between an aspect ratio and a protection layer removal ratio.

FIG. 6 shows results of study on a relationship between an aspect ratio and a removal ratio of the protection layer in a case where the cleaning solution 5 including the hydrogen peroxide water to which the chelator is added, the ammonia water, and water described in the present embodiment is used and a case where mixture solution of sulfuric acid and hydrogen peroxide water, which is used as a conventional cleaning solution is used. The protection layer removal ratio shown in FIG. 6 means a ratio of the number of trenches 3 from which foreign substances including the protection layer 4 are removed when the trenches 3 each having a width of 2 μm and the depth of 47 μm are formed to the silicon substrate 1 and a cross section of 2307 trenches 3 is observed.

As shown in FIG. 6, in a case (VIA) where the cleaning solution 5 according to the present embodiment is used, the protection layer removal ratio is 100% even when the aspect ratio is large, and foreign substances are completely removed from the inside of the trenches 3. On the other hand, in a case (VIB) where the mixed solution of sulfuric acid and hydrogen peroxide water is used as the conventional art, although the protection layer removal ratio is 100% when the aspect ratio is small, the protection layer removal ratio gradually decreases when the aspect ratio is 5 or higher. Thus, it can be said that in a case where the aspect ratio is 5 or higher, using the cleaning solution 5 to which the chelator is added as the present embodiment is effective to completely remove foreign substances including the protection layer 4.

Figure 7:
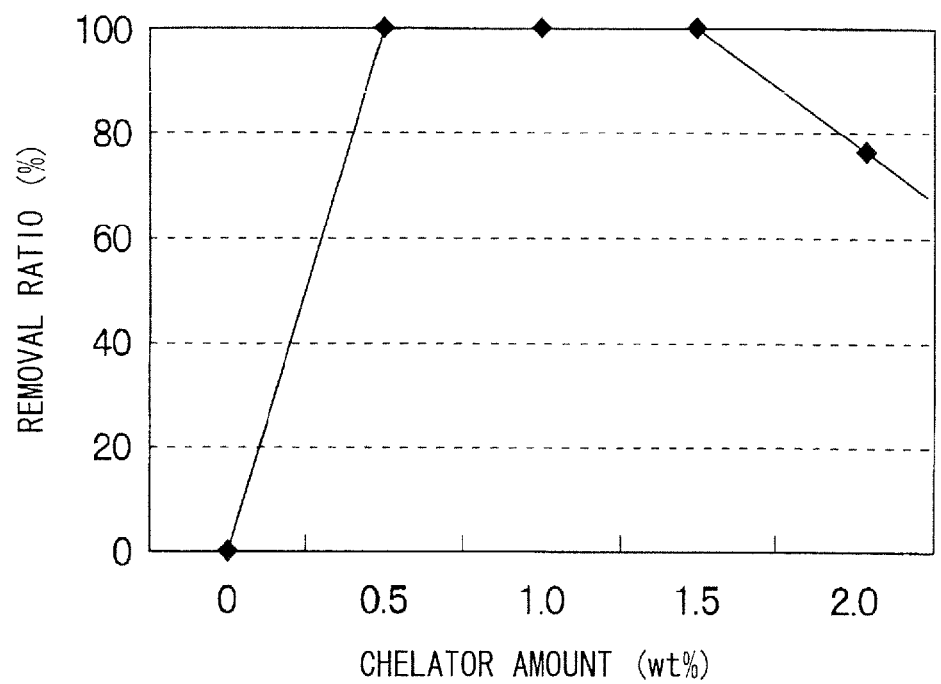
FIG. 7 is a graph showing a relationship between an additive amount of a chelator to hydrogen peroxide water and a protection layer removal ratio.

FIG. 7 is a graph showing a relationship between an additive amount of the chelator to the hydrogen peroxide water and a protection layer removal ratio. Also the protection layer removal ratio shown in FIG. 7 means the number of trenches 3 from which foreign substances including the protection layer 4 are removed when the trenches 3 each having a width of 2 μm and the depth of 47 μm are formed to the silicon substrate 1 and a cross section of 2307 trenches 3 is observed.

As shown in FIG. 7, when the additive amount of the chelator is zero, the protection layer removal ratio is almost zero. When even small amount of the chelator is added, the protection layer removal ratio increases. Especially, when the additive amount of the chelator is within a range from 0.5 weight % to 1.5 weight %, the protection layer removal ratio is 100%. Thus, when the additive amount of the chelator to the hydrogen peroxide water is within a range from 0.5 weight % to 1.5 weight %, foreign substances including the protection layer 4 can be removed more certainly.

Second Embodiment

A manufacturing method of a semiconductor device according to a second embodiment of the present invention will be described with reference to FIG. 8A to FIG. 9C. In the present embodiment, as an example of a manufacturing method of a semiconductor device to which the cleaning process of the inside of the trench described in the first embodiment is applied, a manufacturing method of a semiconductor device including a super junction structure will be described.

Figure 8A:
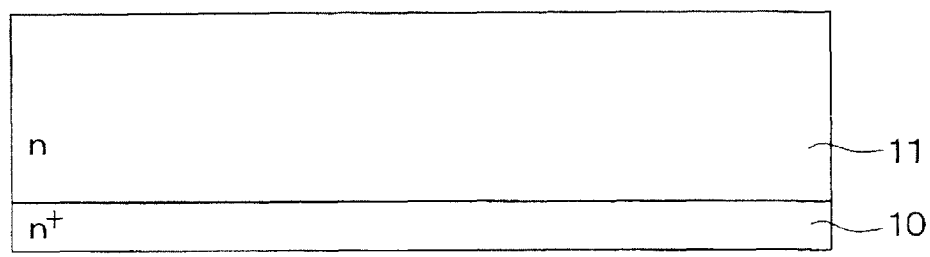
FIG. 8A to FIG. 8D are cross-sectional views showing manufacturing processes of a semiconductor device according to a second embodiment.
Figure 8B:
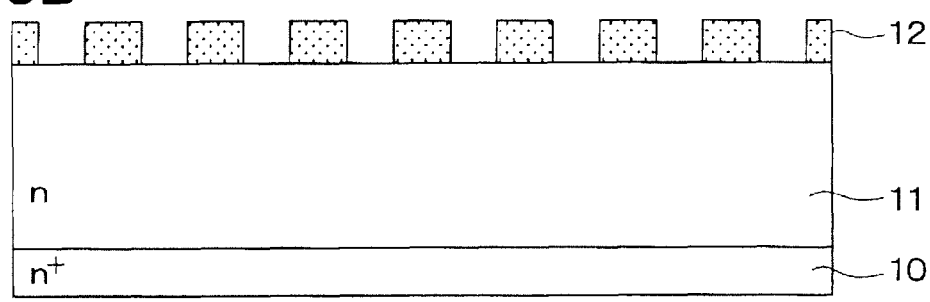
Figure 8C:
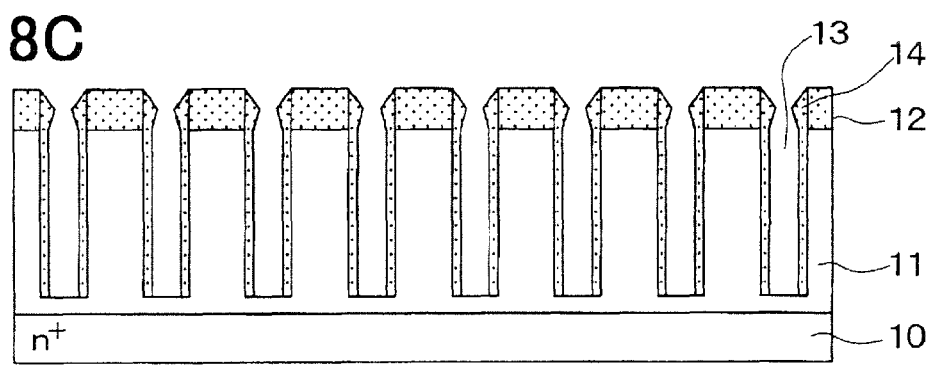

Firstly, as shown in FIG. 8A, a semiconductor substrate in which an $n^-$-type epitaxial layer 11 is grown on an $n^+$-type silicon substrate 10 is prepared. Next, as shown in FIG. 8B, after disposing an oxide layer 12 serving as a trench mask on the semiconductor substrate, a resist, which is not shown, is disposed on the oxide layer 12. The oxide layer 12 is treated by patterning, for example, by reactive ion etching using the resist as a mask. Accordingly, portions of the oxide layer 12 where trenches are to be formed are opened. Then, as shown in FIG. 8C, trenches 13 are formed with the oxide layer 12. The trenches 13 are formed by a trench forming process, for example, using the BOSCH process. Accordingly, a plurality of trenches 13 having a predetermined width and extending in one direction are formed at predetermined intervals.

Figure 8D:
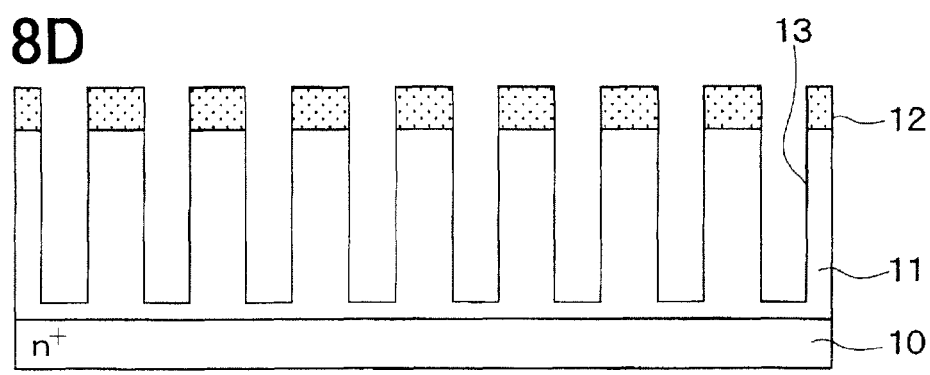

At this time, as shown in FIG. 8C, inner walls of the trenches 13 are covered with the protection layer 14 made of fluorocarbon polymer. Thus, foreign substances including the protection layer 14 are removed with the cleaning solution 5 that is the mixed solution of the hydrogen peroxide water to which the chelator is added, the ammonia water, and water described in the first embodiment. For example, the mixture ratio of the hydrogen peroxide water, the ammonia water, and water in the cleaning solution 5 is within a range from 1:1:4 to 1:1:6 and a temperature of the cleaning solution 5 is 80° C. In addition, a hydrogen peroxide concentration of the hydrogen peroxide water is, for example, 35 weight %, and an ammonia concentration of the ammonia water is, for example, from 28 weight % to 30 weight %. By the cleaning, as shown in FIG. 8D, foreign substances including the protection layer 14 are completely removed from the inside of the trenches 13.

Figure 9A:
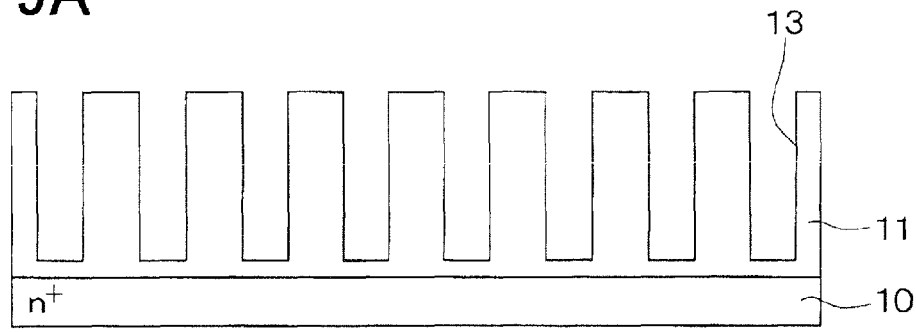
FIG. 9A to FIG. 9C are cross-sectional views showing manufacturing processes of the semiconductor device following FIG. 8D.
Figure 9B:
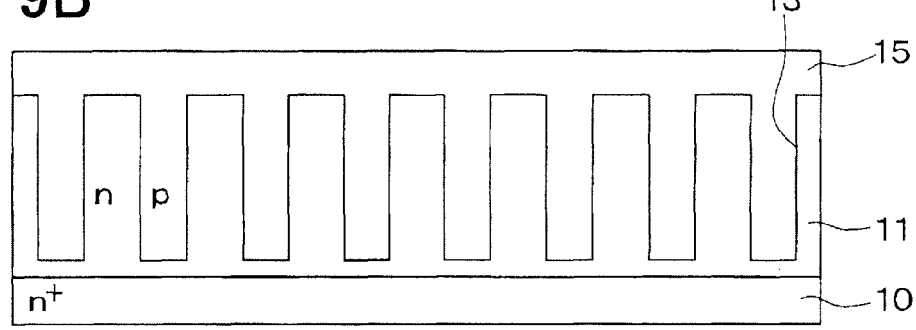

After damage layers on sidewalls of the trenches 13 are removed by Chemical Dry Etching (CDE), as shown in FIG. 9A, the oxide layer 12 is removed with diluted fluoric acid. Then, as shown in FIG. 9B, a p-type silicon layer 15 is formed on the whole surface of the semiconductor substrate including the inside of the trenches 13, for example, by low-pressure CVD, and thereby the inside of the trenches 13 is filled again.

For example, silicon source gas (e.g., $SiH_2Cl_2$) and halide gas (e.g., HCl) are supplied concurrently, and the p-type silicon layer 15 is epitaxially grown in the mixed as at a low pressure so that the trenches 13 are filled again. Accordingly, the a growth rate of the p-type silicon layer 15 at bottoms of the trenches 13 can be higher than a growth rate at opening portions of the trenches 13. Because the p-type silicon layer 15 can be grown from the bottoms of the trenches 13, voids and crystal defects in the p-type silicon layer 15 can be reduced. In this way, by using portions of the p-type silicon layer 15 filled in the trenches 13 as p-type columns and using portions of the $n^-$-type epitaxial layer 11 that remain in the trenches 13 as n-type columns, a super junction structure in which the p-type column and the n-type column are alternately formed can be formed. In addition, a p-type base region can be formed using a portion of the p-type silicon layer 15 formed above the super junction structure.

Figure 9C:
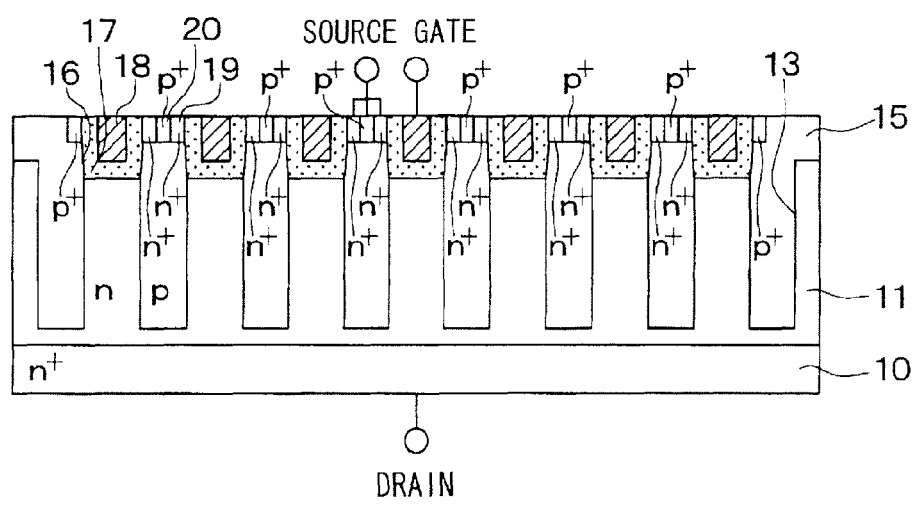

After that, as shown in FIG. 9C, a process of forming trenches 16, a process of forming gate insulating layers 17, a process of forming gate electrodes 18, a process of forming $n^+$-type source regions 19, and a process of forming $p^+$-type body layers 20 are performed. In addition, through a process of forming insulating interlayers, a process of forming gate wirings and source electrodes, and a process of forming drain electrodes, the semiconductor device including vertical MOSFETs having a super junction structure is completed. In the semiconductor device having the above-described configuration, a channel is formed in the p-type base region located on a sidewall of the trench 16 by applying a voltage to the gate electrode 18, and electric current flows between a source and a drain through the channel.

As described above, the mixed solution of the hydrogen peroxide water to which the chelator is added, the ammonia water, and water can be used as a cleaning solution, for example, to remove foreign substances including the protection layer 14 that is formed on the sidewalls of the trenches 13 when the trenches 13 for forming the super junction structure are formed Because the trenches 13 have a high aspect ratio and foreign substances including the protection layer 14 easily remain in the trenches 13, the foreign substances including the protection layer 14 can be effectively removed by using the mixed solution of the hydrogen peroxide water to which the chelator is added, the ammonia water, and water as the cleaning solution.

Other Embodiments

In the above-described embodiments, the cleaning process in a case where the trenches 3 having a high aspect ratio are formed by the BOSCH process is described as an example. Because the aspect ratio of the trenches 3 can be high by the BOSCH process, foreign substances including the protection layer 14 can be effectively removed by using the cleaning method according to the above-described embodiments in the cleaning process thereafter. However, the trenches 3 may also be formed by a method other than the BOSCH process and the cleaning method according to the above-described embodiments can be used when the cleaning process is performed thereafter. Even when the trenches 3 have a width of 10 μm or less, which causes difficulty in penetration of a cleaning solution, and have an aspect ratio of 5 or higher, foreign substances can be removed with certainty by applying the above-described method.

In the above-described embodiments, the cleaning solution 5 is the mixed solution of the hydrogen peroxide water to which the chelator is added, the ammonia water, and water. In other words, the ammonia water is used as a basic solution included in the cleaning solution 5. However, other basic solution can also be used. For example, instead of the ammonia water, tetramethylammonium hydroxide (TMAH) water may also be used. Also in this case, by heating the cleaning solution 5 to a temperature within a range from 50° C. to 100° C., a penetration depth of the cleaning solution 5 in the trenches 3 can be increased and foreign substances including the protection layer 4 can be certainly removed from the trenches 3. A mixture ratio of the hydrogen peroxide water to which the chelator is added, the TMAH water, and water may be, for example, within a range from 1:1:4 to 1:1:6. In the present case, a hydrogen peroxide concentration of the hydrogen peroxide water is, for example, 35 weight %, and a TMAH concentration of the TMAH water is, for example, within a range from 19 weight % to 22 weight %.

As other basic solution, organic amine cleaning solution or potassium hydroxide (KOH) can also be used. However, when such as KOH is used, there is a worry about contamination of alkali metal. Thus, in a case where a semiconductor device in which a contamination of alkali metal does not cause problem, such as KOH can be used as the basic solution.

In the above-described embodiments, the silicon substrate is taken as an example of a semiconductor substrate. However, the semiconductor substrate may also be other silicon composition semiconductor, for example, silicon carbide (SiC), as long as the semiconductor substrate is oxidized by hydrogen peroxide water, that is, the oxide layer 6 is formed and the lift-off effect can be achieved by light-etching, for example, with ammonia water.

In the above-described embodiments, the cleaning process is performed, for example, by soaking the semiconductor substrate in the cleaning solution. However, the cleaning process may also be performed by spraying the cleaning solution to the semiconductor substrate.

In the above-described embodiment, the trenches 3, 13 are taken as examples of a depression to be cleaned with the cleaning solution 5. The cleaning solution 5 may also be used for cleaning a hole other than the trenches 3, 13. In the second embodiment, the super junction structure, in which the PN junctions are repeatedly formed by forming a conductive layer having a different conductivity type from the semiconductor substrate in the trenches 13, is taken as an example. However, as described above, the cleaning solution 5 may also be used when a semiconductor device includes a through electrode in which an electrode is formed in a hole penetrating a semiconductor substrate, a trench capacitor in which a capacitor is formed with a trench, or a micro electro mechanical system (MEMS) including a beam structure body using a trench.

For example, when a semiconductor device including micro electro mechanical system is manufactured with a silicon-on-insulator (SOI) substrate, after a trench penetrating from a surface of the SOI substrate to a buried layer is formed, the buried oxide layer is removed in a horizon direction through the trench. Then, the cleaning solution can be used when the above-described trench is formed.

Because the above-described contamination of alkali metal does not cause problem in the semiconductor device in which the through electrode is formed and the semiconductor device including the micro electro mechanical system, such as KOH can be used as the basic solution included in the cleaning solution.

What is claimed is:

1. A manufacturing method of a semiconductor device comprising:
    forming a depression having a width of 10 µm or less and having an aspect ratio of 5 or higher in a semiconductor substrate made of silicon or silicon compound semiconductor;
    covering a sidewall of the depression with a protection layer made of fluorocarbon polymer;
    soaking the semiconductor substrate in a cleaning solution to remove foreign substances including the protection layer in the depression after forming the depression; and
    filling the depression with a semiconductor layer having a conductivity type different from the semiconductor substrate by epitaxial growth so as to form a super junction structure,
    wherein the cleaning solution includes a mixed solution of hydrogen peroxide water to which a chelator is added, a basic solution, and water,
    wherein the basic solution includes one of ammonia water and tetramethylammonium hydroxide water,
    wherein an additive amount of the chelator to the hydrogen peroxide water is within a range from 0.5 weight % to 1.5 weight %,
    wherein the forming the depression and the covering the sidewall of the depression with the protection layer are performed by a BOSCH process, and
    wherein the removing the foreign substances includes heating the cleaning solution to a temperature within a range from 50° C. to 100° C.

2. The manufacturing method according to claim 1, wherein the cleaning solution has a mixture ratio of the hydrogen peroxide water to which the chelator is added, the ammonia water, and the water within a range from 1:1:4 to 1:1:6.

3. The manufacturing method according to claim 1, wherein the cleaning solution has a mixture ratio of the hydrogen peroxide water to which the chelator is added, the tetramethylammonium hydroxide water, and the water within a range from 1:1:4 to 1:1:6.

4. The manufacturing method according to claim 1, wherein the depression has an aspect ratio between 5 and 45.

* * * * *